(12) United States Patent
Wang et al.

(10) Patent No.: US 12,424,542 B2
(45) Date of Patent: Sep. 23, 2025

(54) SEMICONDUCTOR STRUCTURE AND METHOD FOR MANUFACTURING SAME

(71) Applicant: CHANGXIN MEMORY TECHNOLOGIES, INC., Hefei (CN)

(72) Inventors: Luguang Wang, Hefei (CN); Heng-Chia Chang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 483 days.

(21) Appl. No.: 17/950,229

(22) Filed: Sep. 22, 2022

(65) Prior Publication Data

US 2023/0018552 A1 Jan. 19, 2023

Related U.S. Application Data

(63) Continuation of application No. PCT/CN2022/106498, filed on Jul. 19, 2022.

(30) Foreign Application Priority Data

May 31, 2022 (CN) .......................... 202210606717.5

(51) Int. Cl.
  *H01L 23/522* (2006.01)
  *H01L 23/528* (2006.01)
  *H10B 12/00* (2023.01)
  *H10D 62/17* (2025.01)

(52) U.S. Cl.
  CPC ...... *H01L 23/5228* (2013.01); *H01L 23/5283* (2013.01); *H10B 12/0335* (2023.02); *H10B 12/05* (2023.02); *H10B 12/315* (2023.02); *H10B 12/482* (2023.02); *H10B 12/485* (2023.02); *H10B 12/488* (2023.02); *H10D 62/292* (2025.01)

(58) Field of Classification Search
None
See application file for complete search history.

(56) References Cited

U.S. PATENT DOCUMENTS

| 6,156,604 | A | 12/2000 | Forbes |
| 7,948,027 | B1 | 5/2011 | Renn |
| 2001/0000918 | A1 | 5/2001 | Forbes |

(Continued)

FOREIGN PATENT DOCUMENTS

| CN | 101471304 A | 7/2009 |
| CN | 102339831 A | 2/2012 |
| CN | 111785720 A | 10/2020 |

OTHER PUBLICATIONS

US office action in U.S. Appl. No. 17/950,992, mailed on May 8, 2025.

*Primary Examiner* — Steven M Page

(74) *Attorney, Agent, or Firm* — SYNCODA LLC; Feng Ma

(57) ABSTRACT

A semiconductor structure includes: a substrate; bit lines located in the substrate and including a main body and a plurality of contact portions, the main body extending in a first direction, the contact portions being connected to the main body and extending toward the top surface of the substrate, and the plurality of contact portions being arranged at intervals in the first direction; and transistors located on a top surface of the contact portion, the extension direction of a channel of the transistor being perpendicular to a plane where the substrate is located.

20 Claims, 15 Drawing Sheets

(56) References Cited

U.S. PATENT DOCUMENTS

| | | |
|---|---|---|
| 2002/0053689 A1 | 5/2002 | Forbes |
| 2003/0142564 A1 | 7/2003 | Forbes |
| 2009/0163017 A1* | 6/2009 | Cho .................... H10B 12/053 |
| | | 257/E21.294 |
| 2010/0052029 A1* | 3/2010 | Huang ................ H10D 30/025 |
| | | 257/E27.084 |
| 2010/0295106 A1 | 11/2010 | Huang |
| 2011/0140196 A1 | 6/2011 | Renn |
| 2012/0018801 A1* | 1/2012 | Kobayashi ............. H10B 12/09 |
| | | 257/334 |
| 2012/0119286 A1 | 5/2012 | Kim |
| 2012/0269006 A1 | 10/2012 | Park |
| 2013/0130471 A1 | 5/2013 | Kobayashi et al. |
| 2013/0207181 A1 | 8/2013 | Lee |
| 2019/0006376 A1* | 1/2019 | Ramaswamy ......... H10B 43/27 |
| 2019/0288034 A1 | 9/2019 | Sukekawa |
| 2023/0371242 A1 | 11/2023 | Kang et al. |

\* cited by examiner

SEMICONDUCTOR STRUCTURE AND METHOD FOR MANUFACTURING SAME

CROSS-REFERENCE TO RELATED APPLICATIONS

The present application is a U.S. continuation application of International Application No. PCT/CN2022/106498, filed on Jul. 19, 2022, which claims priority to Chinese Patent Application No. 202210606717.5, filed on May 31, 2022. International Application No. PCT/CN2022/106498 and Chinese Patent Application No. 202210606717.5 are incorporated herein by reference in their entireties.

BACKGROUND

A dynamic Random Access Memory (DRAM) belongs to a volatile memory, which is composed of a plurality of memory cells, each memory cell mainly includes a transistor and a capacitor, and each memory cell is electrically connected to each other through a word line (WL) and a bit line (BL).

In order to improve the integration of the DRAM, a $4F^2$ (where "F" represents the minimum feature size) architecture scheme has been proposed, in which a transistor in the horizontal direction is changed into a transistor in the vertical direction. Such a DRAM is characterized in that a vertically extending active pillar is formed on a substrate, a surrounding gate is formed outside the active pillar, and a buried bit line and a buried word line are formed. Thus, the channel length of the transistor may be kept and the working efficiency of the transistor may be improved in the case where the planar size of the DRAM is reduced.

However, with the improvement of the integration of the DRAM, the size of the transistor is gradually reduced, and the transmission rate of the transistor is limited, which affects the performance of the DRAM.

SUMMARY

In order to solve at least one problem proposed in a background art, the present disclosure provides a semiconductor structure and a method for manufacturing the same. The semiconductor structure can reduce the resistance of a bit line and improve the transmission rate of the DRAM.

In order to achieve the above object, the present disclosure provides a technical scheme as follows.

According to a first aspect, the present disclosure provides a semiconductor structure, which may include a substrate, bit lines and transistors.

The bit line locates in the substrate and includes a main body and a plurality of contact portions, the main body extends in a first direction, the contact portions are connected to the main body and extend toward the top surface of the substrate, and the plurality of contact portions are arranged at intervals in the first direction.

The transistor is located on the top surface of the contact portion; the extension direction of a channel of the transistor is perpendicular to a plane where the substrate is located.

According to another aspect, the present disclosure provides a method for manufacturing the semiconductor structure, which may include the following operations.

A substrate is provided.

Bit lines are formed. The bit line is formed in the substrate and includes a main body and a plurality of contact portions. The main body extends in a first direction, the plurality of contact portions are connected to the main body and extend toward the top surface of the substrate, and the plurality of contact portions are arranged at intervals in the first direction.

Transistors are formed. The transistor is formed on the top surface of the contact portion opposite to the main body, and the extension direction of a channel of the transistor is perpendicular to a plane where the substrate is located.

The structure, and other invention objects and beneficial effects of the disclosure will appear more fully in conjunction with the accompanying drawings and the description of preferred embodiments.

BRIEF DESCRIPTION OF THE DRAWINGS

In order to describe the technical solutions in embodiments of the disclosure or a related art more clearly, the drawings required to be used in descriptions about the embodiments and the related art will be simply introduced below. It is apparent the drawings in the following descriptions are only some embodiments of the disclosure. Those of ordinary skill in the art may further obtain other drawings according to these drawings without creative work.

DETAILED DESCRIPTION

The present disclosure relates to the technical field of semiconductor integrated circuit, and in particular to a semiconductor structure and a method for manufacturing the same.

With the improvement of the integration degree of semiconductor devices, the size of a transistor unit integrated on a substrate of a semiconductor device is gradually reduced. Therefore, a $4F^2$ (F represents the minimum feature size) architecture transistor with a vertical channel is gradually proposed. Compared with a planar 6F² architecture transistor, the area of a 4F² architecture transistor unit may be reduced by about 30%.

Taking a DRAM as an example, the DRAM is composed of a plurality of memory cells arranged in an array. The memory cells are separating by a plurality of groups of word lines and bit lines which are interlaced with each other. Each memory cell is electrically connected with each other through the word lines and the bit lines, and each memory cell mainly includes a transistor and a capacitor.

Figure 1:
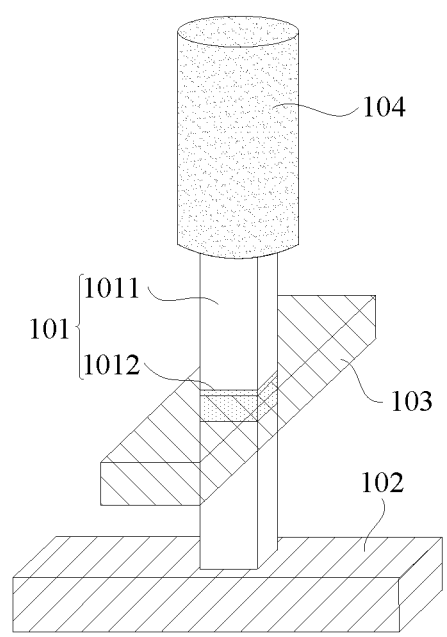
FIG. 1 is a perspective view of a memory cell of a DRAM having a vertical channel transistor in the related art.

FIG. 1 is a perspective view of a memory cell of a DRAM having a vertical channel transistor in the related art. Referring to FIG. 1, for a 4F² architecture memory cell, a transistor 101 includes an active pillar 1011 and a gate insulating layer 1012. The active pillar 1011 extends upward and is perpendicular to a plane where a substrate (not shown in the figure) is located, and the gate insulating layer 1012 is arranged around the periphery of the active pillar 1011. A bit line 102 is buried into the substrate and connected to the bottom of the active pillar 1011. A word line 103 is located in a height interval where the active pillar 1011 is located and connected to the gate insulating layer 1012. A contact plug 104 is formed at the top of the active pillar 1011, a capacitor (not shown in the figure) is formed on the contact plug 104, and the capacitor is electrically connected to the active pillar 1011 through the contact plug 104.

However, in an existing 4F² architecture DRAM, the resistance of the bit line 102 is high, and there is a large parasitic capacitance between bit lines 102, which limits the transmission rate of the transistor 101 and affects the performance of the DRAM.

In view of this, embodiments of the disclosure provide a semiconductor structure and a method for manufacturing the same. In the semiconductor structure, a contact portion is connected to a main body of the bit line, so that the contact portion extends toward the top surface of a substrate. Through the contact portion, the volume of the bit line is increased, the burying depth of the bit line is deepened, and the transmission rate of the transistor is increased, thereby improving the performance of the semiconductor structure.

In order to make the purposes, technical solutions and advantages of the embodiments of the disclosure clearer, the technical solutions in the embodiments of the disclosure will be clearly and completely described below in combination with the drawings in the embodiments of the disclosure, and it is apparent that the described embodiments are only a part rather all of embodiments of the disclosure. All other embodiments obtained by those of ordinary skill in the art based on the embodiments in the disclosure without creative work shall fall within the scope of protection of the disclosure.

The embodiment provides a semiconductor structure, and the semiconductor structure may be a memory device or a non-memory device. The memory device may include, for example, a Dynamic Random Access Memory (DRAM), a Static Random Access Memory (SRAM), a flash memory, an Electrically Erasable Programmable Read-Only Memory (EEPROM), a Phase Change Random Access Memory (PRAM) or a Magnetoresistive Random Access Memory (MRAM). The non-memory device may be a logic device (such as a microprocessor, a digital signal processor or a microcontroller) or a similar device.

Hereinafter, the semiconductor structure is described by taking a DRAM as an example.

Figure 2:
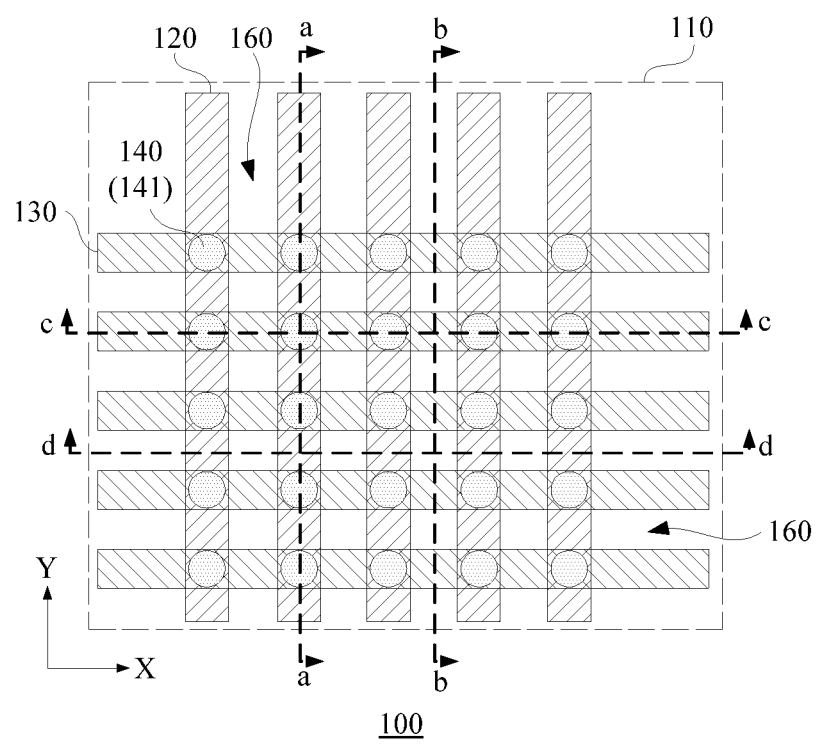
FIG. 2 is a top perspective view of a substrate of a semiconductor structure according to embodiments of the disclosure.
Figure 3:
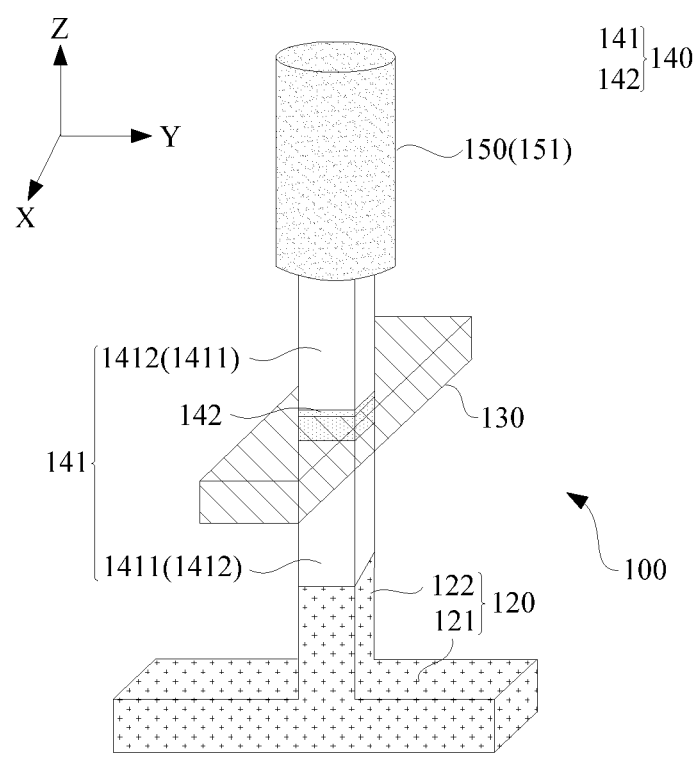
FIG. 3 is a stereo perspective view of a semiconductor structure according to embodiments of the disclosure.
Figure 4:
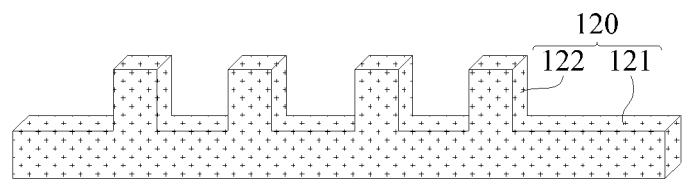
FIG. 4 is a schematic structural diagram of a bit line according to embodiments of the disclosure.
Figure 5:
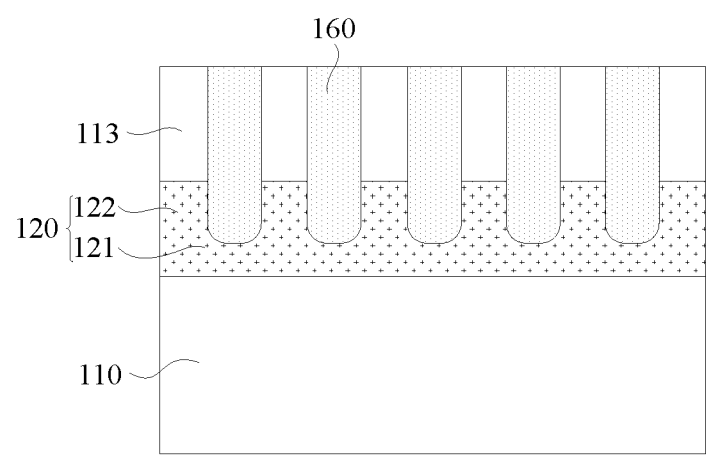
FIG. 5 is a cross-sectional view at a-a corresponding to the semiconductor structure in FIG. 2.
Figure 6:
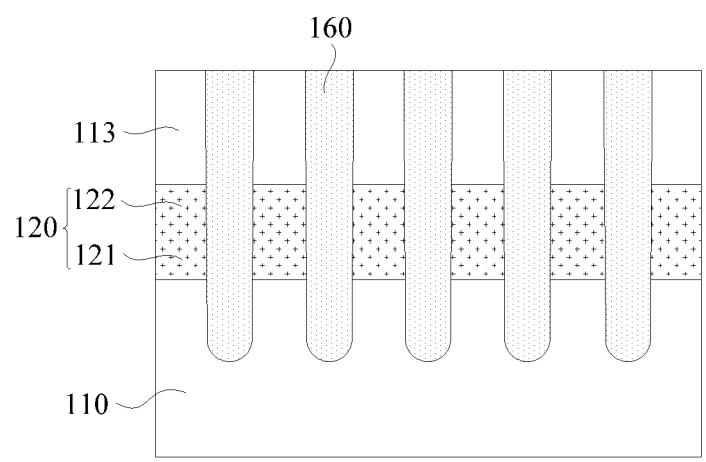
FIG. 6 is a cross-sectional view at c-c corresponding to the semiconductor structure in FIG. 2.

FIG. 2 is a top perspective view of a substrate of a semiconductor structure according to embodiments of the disclosure. FIG. 3 is a stereo perspective view of a semiconductor structure according to embodiments of the disclosure. FIG. 4 is a schematic structural diagram of a bit line according to embodiments of the disclosure. FIG. 5 is a cross-sectional view at a-a corresponding to the semiconductor structure in FIG. 2. FIG. 6 is a cross-sectional view at c-c corresponding to the semiconductor structure in FIG. 2.

Referring to FIG. 2, a semiconductor structure 100 includes a substrate 110, and the substrate 110 is generally a semiconductor substrate 110. The material constituting the substrate 110 may include at least one of monocrystalline silicon, polycrystalline silicon, amorphous silicon, silicon germanium compound and silicon-on-insulator (SOI); or the material constituting the substrate 110 may be other materials known to those skilled in the art.

A plurality of bit lines 120 and a plurality of bit lines word lines 130 that are buried are formed in the substrate 110. The bit lines 120 are parallel to each other, the bit lines 120 extend in a first direction, and the bit lines 120 may be arranged at equal intervals. Similar to the bit lines 120, the word lines 130 are parallel to each other, the word lines 130 extend in a second direction, and the word lines 130 may be arranged at equal intervals. The substrate 110 is divided into a plurality of regions arranged in an array by the bit lines 120 and word lines 130, and these regions correspond to the memory cells of the DRAM. Herein, the first direction and the second direction cross each other. Exemplarily, the first direction and the second direction may be perpendicular to each other. For example, the first direction is the Y direction in FIG. 2, and the second direction is the X direction in FIG. 2.

Continuously referring to FIG. 2, transistors 140 are also formed in the substrate 110. For a transistor 140 with a vertical channel, the transistor 140 generally includes an active pillar 141, and the active pillar 141 extends in a direction perpendicular to the plane direction of the substrate 110. That is, the active pillar 141 extends toward the top surface of the substrate 110 in the thickness direction of the substrate 110.

It is to be noted that in the thickness direction of the substrate 110, every bit line 120 is usually located at the same level, and every word line 130 is also usually located at the same level. Moreover, the bit lines 120 and word lines 130 are usually located in different height intervals. The bit lines 120 and word lines 130 are isolated from each other, and the adjacent bit lines 120 and word lines 130 are also isolated from each other, so that the operation of every memory cell is controlled by the bit lines 120 and word lines 130. The active pillar 141 may be formed in an overlapping region of the bit line 120 and the word line 130 to facilitate the connection of the bit line 120 and the word line 130 to the transistor 140.

Referring to FIG. 3, specifically, in the thickness direction (Z direction in the figure) of the substrate 110, the active pillar 141 is arranged on the bit line 120, the bottom of the active pillar 141 contacts the bit line 120, and the active pillar 141 vertically extend upward. The capacitor structure 150 of the DRAM is arranged at the top of the active pillar 141, and the capacitor structure 150 includes a contact plug 151 and a capacitor (not shown in the figure). The contact plug 151 is located at the top of the active pillar 141 and contacts with the active pillar 141. The capacitor is usually arranged on the contact plug 151, and the capacitor is electrically connected to the active pillar 141 through the contact plug 151.

The word line 130 is arranged above the bit line 120, and the word line 130 is located in a height region where the active pillar 141 is located. The word line 130 may be arranged corresponding to the active pillar 141. Exemplarily, the active pillar 141 may pass through the word line 130 to facilitate the electrical connection between the word line 130 and the active pillar 141.

As shown in FIGS. 2 and 3, the embodiment can reduce the plane size of the transistor 140 and effectively reduce the space occupied by the transistor 140 in the substrate 110 by providing the transistor 140 with a vertical channel, thereby increasing the density of the transistors 140 in the substrate 110 and enhancing the integration level of the DRAM.

The active pillar 141 may include a source 1411 region, a channel region (not shown in the figure) and a drain 1412 region; and the source 1411 region, the channel region and the drain 1412 region are sequentially arranged in the length direction of the active pillar 141. Exemplarily, the source 1411 region, the channel region and the drain 1412 region are sequentially from the bottom to the top of the active pillar 141; or the drain 1412 region, the channel region and the source 1411 region are sequentially from the bottom to the top of the active pillar 141. Description is made below with the source 1411 region, the channel region and the drain 1412 region sequentially from the bottom to the top of the active pillar 141 as an example.

Referring to FIG. 3, as an embodiment, in the embodiment, the transistor 140 may only include an active pillar 141, and turn-on and turn-off of the transistor 140 is directly controlled by the word line 130. Herein, a gate insulating layer 142 is surrounded on the outer sidewall of the active pillar 141, and the gate insulating layer 142 covers the outer sidewall of the channel region of the active pillar 141. The word line 130 is arranged corresponding to the gate insulating layer 142, and the word line 130 surrounds the periphery of the gate insulating layer 142.

That is, the source 1411 region of the active pillar 141 is connected to the bit line 120, the drain 1412 region of the active pillar 141 is connected to the capacitor structure 150, and the word line 130 surrounds the gate insulating layer 142 covered on the outer sidewall of the channel region of the active pillar 141. Generally, a word line 130 driver is also arranged in the DRAM. The word line 130 is connected to the word line 130 driver, and the word line 130 driver inputs a voltage signal into the word line 130. The voltage signal on the word line 130 may conduct the source 1411 region and drain 1412 region of the active pillar 141, so that the transistor 140 is turned on to connect the bit line 120 and the capacitor structure 150. Data stored in the capacitor is read through the bit line 120, or the data is written into the capacitor through the bit line 120 for storage.

In practical application, by designing parameters such as the position and width of the word line 130, for example, as shown in FIG. 3, the word line 130 may completely surround the active pillar 141, and the active pillar 141 passes through a middle region in the width direction of the word line 130. Alternatively, the word line 130 may surround part of the periphery of the active pillar 141. For example, a center line in the width direction of the word line 130 deviates from a central axis of the active pillar 141, the word line 130 surrounds part of the outer sidewall of the channel region of the active pillar 141, and the other part of the outer sidewall of the channel region of the active pillar 141 may be exposed outside the word line 130.

Corresponding to the word line 130, the gate insulating layer 142 located between the word line 130 and the outer sidewall of the channel region of the active pillar 141 may be a ring structure. That is, the gate insulating layer 142 surrounds the entire outer sidewall of the channel region. Or, the gate insulating layer 142 may also be a semi-ring structure. That is, the gate insulating layer 142 surrounds part of the region of the outer sidewall of the channel region, while the other part of the region of the outer sidewall of the channel region may be exposed outside the gate insulating layer 142.

In addition, in order to ensure the insulation effect of the gate insulating layer 142 and avoid the leakage of the word line 130, on the basis that the gate insulating layer 142 can completely cover a thickness region of the channel region, the extension height of the gate insulating layer 142 may be larger than the thickness of the word line 130, and the thickness region of the word line 130 is located in a coverage region of the gate insulating layer 142. Exemplarily, at least one side of the gate insulating layer 142 may be exposed outside the word line 130.

As another embodiment, the transistor 140 may also include a gate (not shown in the figure), and the gate may be wrapped outside the gate insulating layer 142. That is, the gate is arranged between the word line 130 and the gate insulating layer 142, and the gate contacts the word line 130. The voltage signal on the word line 130 acts on the gate, and the source 1411 region and the drain 1412 region of the active pillar 141 are turned on through the gate, thereby turning on the transistor 140.

Referring to FIG. 4, in the embodiment, the bit line 120 includes a main body 121 and a plurality of contact portions 122, and the contact portions 122 extend to a surface of the main body 121 opposite to the bottom of the substrate 110. That is, the contact portions 122 extend out of the top surface of the main body 121. For example, the contact portions 122 extend vertically toward the top surface of the substrate 110. As shown in FIG. 3, the active pillar 141 of the transistor 140 is arranged on the contact portion 122, and the bottom of the active pillar 141 contacts the top of the contact portion 122. As shown in FIG. 2, the main body 121 of the bit line 120 extends in the first direction (Y direction), and the contact portions 122 are arranged at intervals in the first direction. That is, the contact portions 122 are arranged at intervals in the extension direction of the bit line 120, the contact portions 122 and the active pillars 141 are in one-to-one correspondence, and each active pillar 141 is located on the top of the corresponding contact portion 122, so as to ensure that every active pillar 141 is located in the same horizontal height region.

Referring to FIG. 3, the bit line 120 is arranged in a structural form including a main body 121 and a contact portion 122, the contact portion 122 extends out of the top surface of the main body 121, and the bottom of the active pillar 141 contacts the top of the contact portion 122. Compared with a conventional bit line 120 (for example, the bit line 120 shown in FIG. 1), the embodiment increases the volume of the bit line 120 by providing the contact portion 122 to the main body 121, and the contact portion 122 is arranged between the main body 121 and the active pillar 141, thus increasing the distance between the main body 121 and the active pillar 141, and reducing the resistance of the bit line 120.

The speed of writing data into or reading data from the capacitor depends on the resistance of the bit line 120. The lower the resistance of the bit line 120 is, the faster the data transmission speed is. Therefore, by arranging the contact portion 122, the embodiment increases the volume of the bit line 120, increases the distance between the main body 121 of the bit line 120 and the active pillar 141, and reduces the resistance of the bit line 120, thereby increasing the data transmission speed of the memory cell of the DRAM and improving the performance of the DRAM.

Referring to FIG. 5, a cross-sectional view at a-a of the semiconductor structure 100 in FIG. 2 is illustrated. The bit line 120 shown in the figure is a cross-sectional structure in the extension direction thereof. It is to be seen that the bit line 120 is formed in the substrate 110. The bit line 120 includes a main body 121 extending in the extension direction thereof and a plurality of contact portions 122 extending out of the main body 121. The contact portions 122 are arranged at intervals in the extension direction of the bit line 120, and the contact portions 122 are mutually isolated through isolation structures 160.

In practical application, an initial semiconductor pillar 113 may be formed in the substrate 110 first, and then the bit line 120 may be formed in the substrate 110 by processing the substrate 110. The bit line 120 includes the substrate 110 region (main body 121) located below the semiconductor pillar 113 and a bottom region (contact portion 122) of the semiconductor pillar 113. That is, the bit line 120 may be formed in the substrate 110 at one time through the same step, and the bit line 120 is an integrally formed structure. Thus, the structural strength of the bit line 120 may be improved, and the reliability of the DRAM may be enhanced.

After the bit line 120 is formed in the substrate 110, the semiconductor pillar 113 may be formed as the active pillar 141 by means of doping. Taking an N-doped silicon substrate as an example of the substrate 110, the active pillar 141 may be formed by P-doping to the semiconductor pillar 113. Then, a word line 130 is formed in the substrate 110, and a capacitor structure 150 is formed on the top of the active pillar 141.

Referring to FIG. 6, a cross-sectional view at c-c in the semiconductor structure 100 in FIG. 2 is illustrated, which shows the cross-sectional structure in a direction (for example, the extension direction of the word line 130) perpendicular to the extension direction of the bit line 120. It is to be seen that a plurality of bit lines 120 are arranged in the substrate 110 at intervals, and adjacent bit lines 120 are isolated from each other by the isolation structures 160. Herein, in combination with FIG. 2, FIG. 6 shows the part of the bit line 120 that overlaps with the word line 130. The upper part thereof is the contact portion 122, and the lower part is the main body 121.

In the embodiment, the height of the contact portion 122 of the bit line 120 may be 50-200 nm. On the one hand, the height of the contact portion 122 is greater than or equal to 50 nm to ensure that the bit line 120 has a contact portion 122 with a certain height, so as to effectively increase the volume of the bit line 120, reduce the resistance of the bit line 120, and improve the data transmission speed of the DRAM. On the other hand, the height of the contact portion 122 is less than or equal to 200 nm, so as to prevent the contact portion 122 from being too high, and avoid the region of the semiconductor pillar 113 occupied by the contact portion 122 from being too large, further to prevent the volume of the active pillar 141 from being affected thereby, or prevent the semiconductor pillar 113 from being too high (to ensure that a sufficient height is reserved for the active pillar 141) to affect the stability of the semiconductor pillar 113 and prevent the semiconductor pillar 113 from tilting or collapsing.

Exemplarily, the height of the contact portion 122 of the bit line 120 may be 60 nm, 70 nm, 80 nm, 90 nm, 100 nm, 110 nm, 120 nm, 130 nm, 140 nm, 150 nm, 160 nm, 170 nm, 180 nm or 190 nm.

On the basis of the above embodiments, the embodiments of the disclosure also provide a method for manufacturing the semiconductor structure (hereinafter referred to as the manufacturing method), and the manufacturing method is used for manufacturing the above semiconductor structure 100. Detailed description is made below to the manufacturing method.

Figure 7:
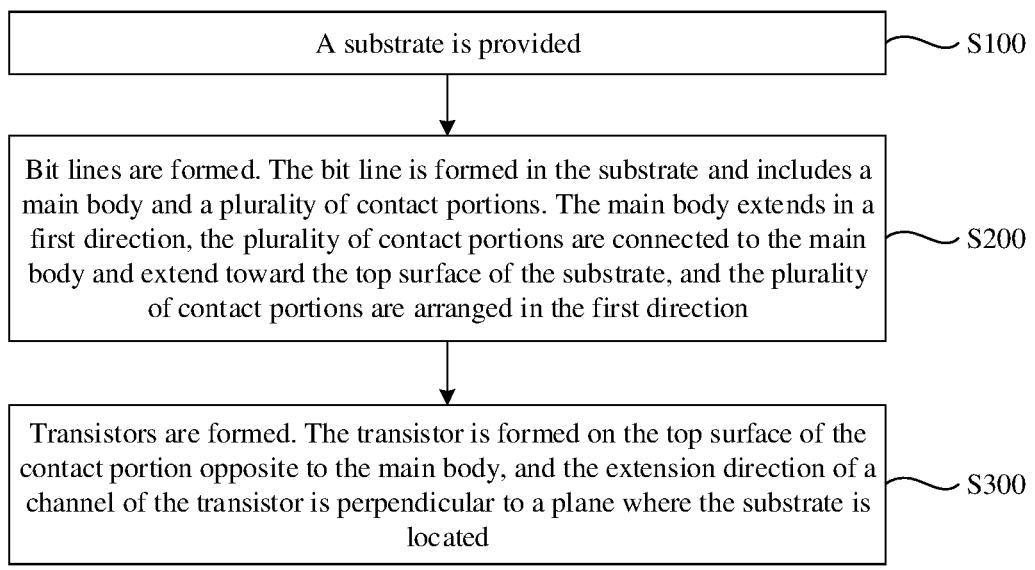
FIG. 7 is a flowchart of a method for manufacturing a semiconductor structure according to embodiments of the disclosure.
Figure 8:
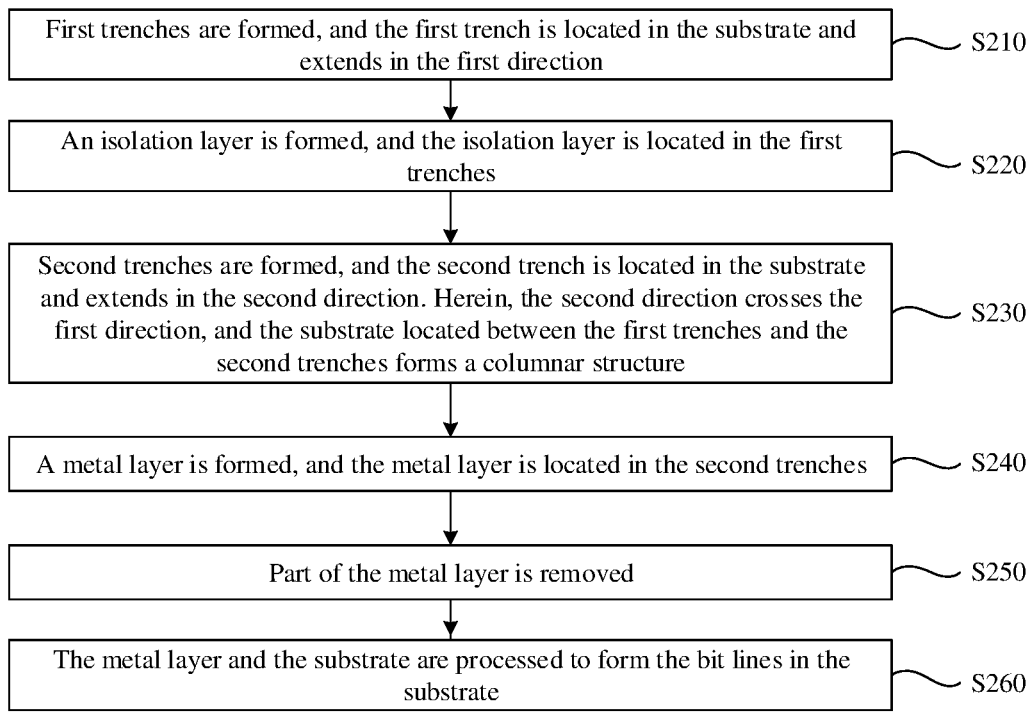
FIG. 8 is a flowchart for forming bit lines according to embodiments of the disclosure.
Figure 9:
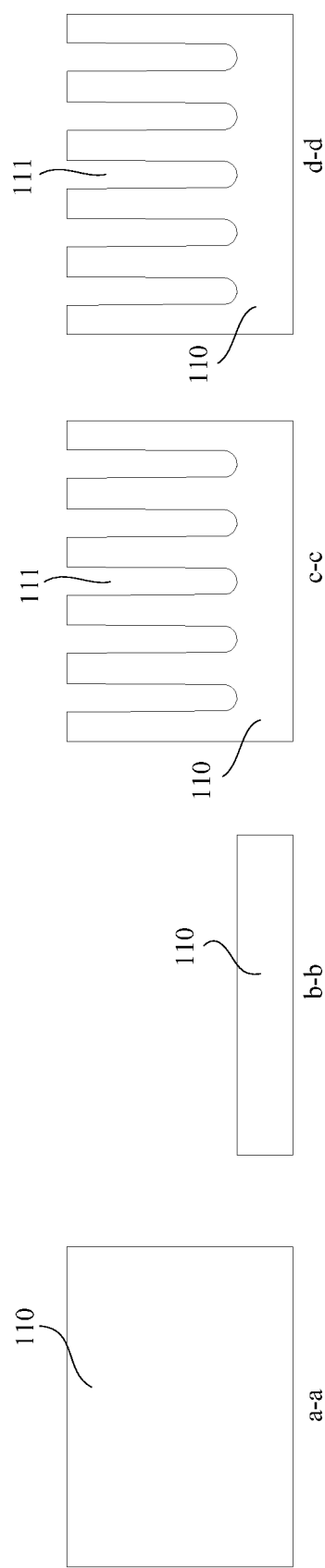
FIG. 9 illustrates cross-sectional view for forming first trenches in the substrate in FIG. 2.
Figure 10:
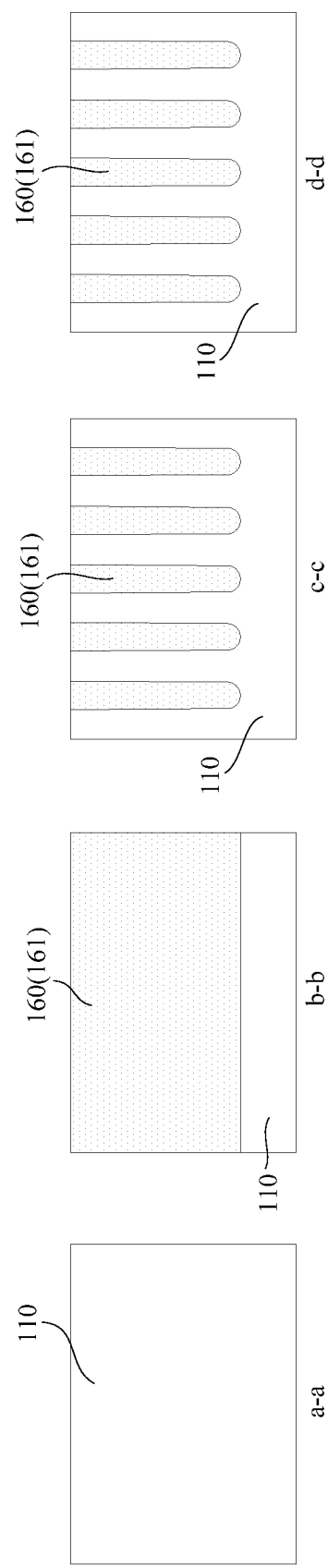
FIG. 10 illustrates cross-sectional views for forming an isolation layer in the substrate in FIG. 2.
Figure 11:
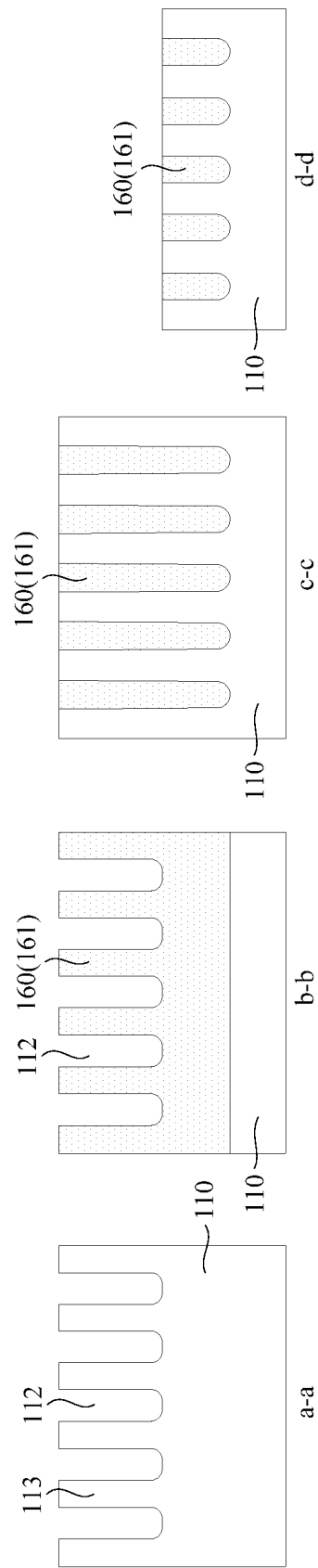
FIG. 11 illustrates cross-sectional views for forming second trenches in the substrate in FIG. 2.
Figure 12:
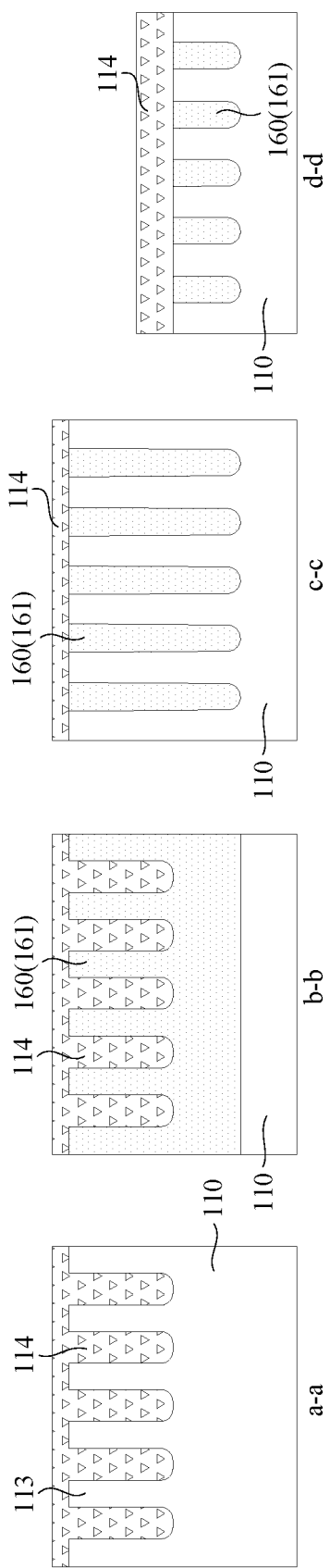
FIG. 12 illustrates cross-sectional views for forming a metal layer in the substrate in FIG. 2.
Figure 13:
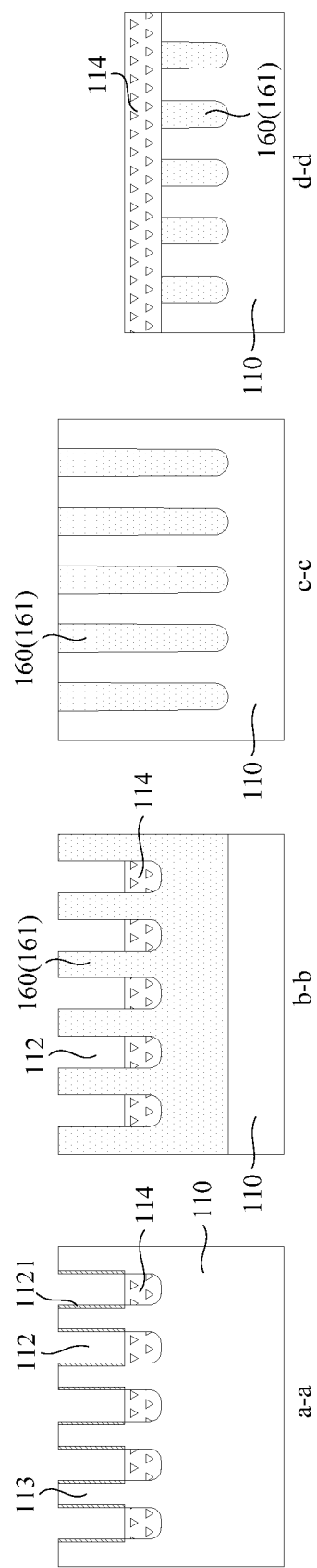
FIG. 13 illustrates cross-sectional views for removing part of the metal layer in the substrate in FIG. 2.
Figure 14:
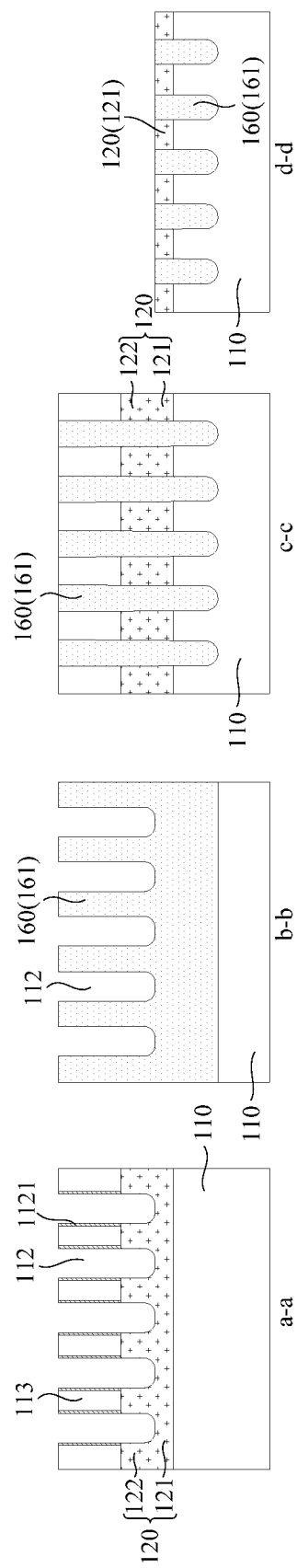
FIG. 14 illustrates cross-sectional views for forming bit lines in the substrate in FIG. 2.
Figure 15:
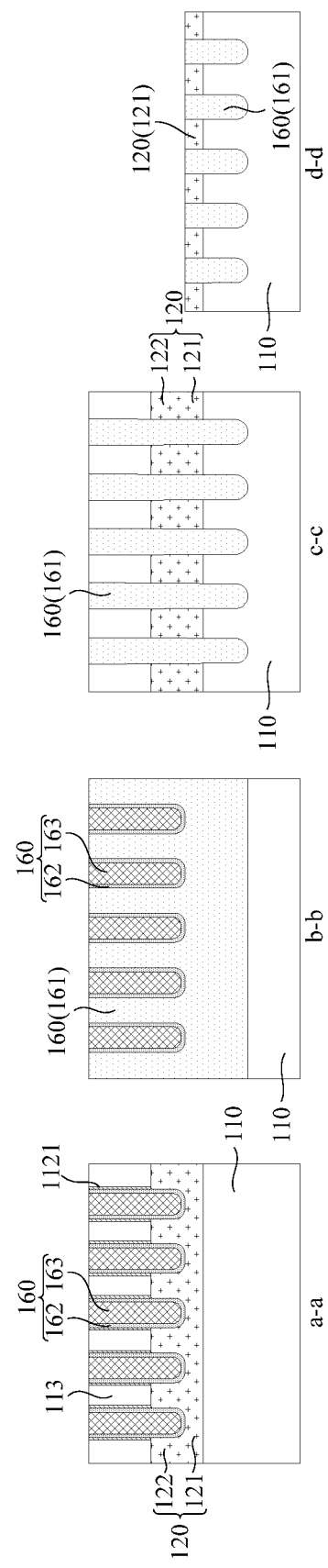
FIG. 15 illustrates cross-sectional views for forming a silicon oxide layer and a silicon nitride layer in the substrate in FIG. 2.

FIG. 7 is a flowchart of a method for manufacturing a semiconductor structure according to embodiments of the disclosure. FIG. 8 is a flowchart for forming a bit line according to embodiments of the disclosure. FIG. 9 illustrates cross-sectional views for forming first trenches in the substrate in FIG. 2. FIG. 10 illustrates cross-sectional views for forming an isolation layer in the substrate in FIG. 2. FIG. 11 illustrates cross-sectional views for forming second trenches in the substrate in FIG. 2. FIG. 12 illustrates cross-sectional views for forming a metal layer in the substrate in FIG. 2. FIG. 13 illustrates cross-sectional views for removing part of the metal layer in the substrate in FIG. 2. FIG. 14 illustrates cross-sectional views for forming a bit line in the substrate in FIG. 2. FIG. 15 illustrates cross-sectional views for forming a silicon oxide layer and a silicon nitride layer in the substrate in FIG. 2.

As shown in FIG. 7, the manufacturing method includes the following operations.

At S100, a substrate is provided.

Referring to FIG. 9, first, a substrate 110 with a certain thickness is provided. The substrate 110 may be a semiconductor substrate 110. The material constituting the substrate 110 may include at least one of monocrystalline silicon, polycrystalline silicon, amorphous silicon, silicon germanium compound and silicon-on-insulator (SOI), or the material constituting the substrate 110 may be other materials known to those skilled in the art.

At S200, bit lines are formed. The bit line is formed in the substrate and includes a main body and a plurality of contact portions. The main body extends in a first direction, the plurality of contact portions are connected to the main body and extend toward the top surface of the substrate 110, and the plurality of contact portions 122 are arranged at intervals in the first direction.

After the substrate 110 is formed, the bit lines 120 are formed in the substrate 110. As shown in FIG. 3, the formed bit line 120 includes a main body 121 and a plurality of contact portions 122. The main body 121 extends in the extension direction (Y direction in FIG. 3) of the bit line 120. The plurality of contact portions 122 are formed on the top surface of the main body 121 opposite to the bottom of the substrate 110, and the contact portions 122 are arranged at intervals in the extension direction of the main body 121 so that active pillars 141 are formed at the top of contact portions 122 in a one-to-one correspondence.

Referring to FIG. 8, the operation of forming bit lines 120 specifically includes the following operations.

At S210, first trenches are formed, and the first trench is located in the substrate and extends in the first direction.

Referring to FIG. 9, after the substrate 110 is formed, first trenches 111 are etched in the substrate 110, and the first trench 111 extends in the first direction. That is, the first trench 111 extends in the extension direction of the bit line 120. Herein, the first trench 111 is located in a region between adjacent bit lines 120, so as to form an initial structure of the bit lines 120 in the region of the substrate 110 that is not etched and remains.

It is to be noted that FIG. 9 illustrates cross-sectional views of a-a, b-b, c-c and d-d in FIG. 2 from left to right, and the subsequent cross-sectional views are similar thereto, which is not repeated here.

At S220, an isolation layer is formed, and the isolation layer is located in the first trenches.

Referring to FIG. 10, after the first trenches 111 are etched in the substrate 110, an isolation layer 161 is deposited in the first trenches 111. The isolation layer 161 completely fills the first trenches 111, and the isolation layer 161 is the isolation structures 160 between adjacent bit lines 120. Exemplarily, the isolation material constituting the isolation layer 161 is, for example, $SiO_2$, and $SiO_2$ may be deposited in the first trenches 111 by CVD process.

At S230, second trenches are formed, and the second trench is located in the substrate and extends in the second direction. Herein, the second direction crosses the first direction, and the substrate located between the first trenches and the second trenches forms a columnar structures.

Referring to FIG. 11, after the isolation layer 161 is formed in the first trenches 111, the second trenches 112 are etched in the substrate 110 in the second direction (the extension direction of the word line 130). That is, the second trenches 112 are etched in the X direction shown in FIG. 2. Thus, a plurality of columnar structures are formed in the region of the substrate 110 that is not etched. The columnar structures are located in a region defined by the first trenches 111 and the second trenches 112, and the columnar structures are initial semiconductor pillars 113.

Herein, in the extension direction (the first direction) of the bit line 120, part of the thickness region of the substrate 110 located below the semiconductor pillar 113 is used to form the main body 121 of the bit line 120. In the semiconductor pillar 113, a height region from the bottom upward is used to form the contact portion 122 of the bit line 120, and other regions of the semiconductor pillar 113 may be used to form the active pillar 141.

At S240, a metal layer is formed, and the metal layer is located in the second trenches.

Referring to FIG. 12, after the second trenches 112 are etched in the substrate 110, the metal layer 114 is deposited in the second trenches 112. For example, the metal layer 114 may be deposited in the second trenches 112 by PVD process, and the metal layer 114 is used to penetrate into the substrate 110 around the second trenches 112 to form a final required conductive body. Exemplarily, the metal material constituting the metal layer 114 may be tungsten or aluminum.

It is to be noted that in order to ensure that the contact portion 122 of the bit line 120 has an appropriate height, when the metal layer 114 is deposited in the second trenches 112, the filling height of the metal layer 114 is usually higher than an actual required height. For example, as shown in FIG. 12, the deposited metal layer 114 completely fills the second trenches 112, so as to prevent the contact portion 122 of the bit line 120 formed subsequently from not meeting the height requirement. Then, the height of the metal layer 114 in the second trenches 112 is reduced to accurately control the height of the remaining metal layer 114 and meet the height requirement of the contact portion 122 of the bit line 120.

At S250, part of the metal layer is removed.

Since the height of the deposited metal layer 114 is usually larger than the actual required height, as shown in FIG. 13, after the metal layer 114 is deposited in the second trenches 112, it is usually necessary to remove part of the height of the metal layer 114 so that the height of the remaining metal layer 114 meets the height requirement of the contact portion 122 of the bit line 120.

Exemplarily, after part of the metal layer 114 is removed, the height of the remaining metal layer 114 in the second trenches 112 may occupy ⅒-½ of the depth of the second trench 112. For example, the height of the remaining metal layer 114 is ¼, ⅕, ⅙, ⅐, ⅛ or ⅑ of the depth of the first trench 111, so that the remaining metal layer 114 meets the requirements of the bit line 120. For example, the height of the formed contact portion 122 may be kept in a range of 50 nm to 200 nm.

Herein, a wet etching process may be employed to etch and remove part of the height of the metal layer 114, leaving only part of the height of the metal layer 114 located in the lower region of the second trenches 112. Exemplarily, an oxidizing solution may be employed as an etching liquid to etch the metal layer 114. For example, a mixed solution of HCl and $H_2O_2$ is employed as the etching liquid. As shown in FIG. 13, in the process of etching the metal layer 114, the oxidizing etching liquid may oxidize the silicon substrate on the inner sidewalls of the second trenches 112 to form an oxide layer 1121 on the sidewall surfaces of the second trenches 112.

The oxide layer 1121 is formed on the sidewall surfaces of the second trenches 112, and part of the thickness region of the semiconductor pillar 113 close to the sidewall surfaces is converted into the oxide layer 1121, which means the diameter of the semiconductor pillar 113 is reduced, that is, the diameter of the active pillar 141 formed subsequently is reduced. For this reason, the diameter and size of the gate insulating layer 142 around the periphery of the channel regions of the active pillars 141 are reduced, the size of the gate insulating layer 142 is reduced, and the switching speed of the transistor 140 can be increased.

Furthermore, due to the reduction of the diameter of the active pillar 141, the diameter of the contact portion 122 of the bit line 120 formed subsequently is larger than the diameter of the active pillar 141, and the volume of the contact portion 122 is larger than the volume of the source 1411 region/drain 1412 region in the active pillar 141, which can reduce the resistance of the bit line 120, improve the data transmission speed of the memory cell of the DRAM, and improve the performance of the DRAM.

At S260, the metal layer and the substrate are processed to form the bit lines in the substrate.

After the height of the remaining metal layer 114 in the second trenches 112 meets the requirement, as shown in FIG. 14, the metal layer 114 and the substrate 110 need to be subjected to heat treatment, so that the metal layer 114 penetrates into the substrate 110 to form metal silicide, and a region of the substrate 110 where the metal silicide is located forms the conductive body of the bit line 120.

Metal particles in the metal layer 114 penetrate into the surrounding substrate 110 from the inner wall surface of the second trench 112. Herein, the metal particles in the metal layer 114 diffuse from the bottom region of the second trench 112 into the substrate 110 below the second trench 112, forming the main body 121 of the bit lines 120, and the metal layer 114 horizontally diffuses from the sidewall region of the second trench 112 into the semiconductor pillar 113, forming the contact portion 122 of the BL 120.

Specifically, the metal layer 114 and the substrate 110 may be processed by an annealing process, so that the metal particles of the metal layer 114 penetrate into the substrate 110 to form a metal composite layer, i.e., the metal silicide layer, so as to form the conductive body of the bit line 120 in the substrate 110. Herein, the annealing temperature may be between 300° C. and 800° C. For example, the annealing temperature is 400° C., 450° C., 500° C., 550° C., 600° C., 650° C., 700° C., 750° C. or 800° C., etc.

After the heat treatment process, for the metal particles that do not penetrate into the substrate 110 (i.e., the metal layer 114 remaining in the second trenches 112), the metal layer 114 remaining in the second trenches 112 may be removed by an etching process, so as to prevent the remaining metal layer 114 from affecting the isolation performance between the bit lines 120. Exemplarily, the metal layer 114 remaining in the second trench 112 may be etched and removed using a mixed solution of $H_2O_2$ and HCl as the etching liquid.

Referring to FIG. 15, after the bit lines 120 are formed, the second trenches 112 may be filled with an isolation material to form isolation structures 160 in the second trenches 112, and the semiconductor pillars 113 are isolated from each other by the isolation layer 161 between the bit lines 120 and the isolation structures 160 in the second trenches 112.

Herein, the isolation structure 160 is formed in the second trench 112 may include a silicon oxide layer 162 and a silicon nitride layer 163. The silicon oxide layer 162 may be deposited in the second trench 112, and the silicon oxide layer 162 covers the inner wall surface of the second trench 112. Then the silicon nitride layer 163 may be deposited in the second trench 112, and the silicon nitride layer 163 covers the silicon oxide layer 162 and completely fills the second trench 112.

At S300, transistors are formed. The transistor is formed on the top surface of the contact portion opposite to the main body, and the extension direction of a channel of the transistor is perpendicular to a plane where the substrate is located.

After the isolation structure 160 is formed in the second trench 112, the transistor 140 may then be formed in the substrate 110. Specifically, the semiconductor pillar 113 may be subjected to doping processing, so that the semiconductor pillar 113 forms the active pillar 141. Then, a gate insulating layer 142 around the periphery of the active pillar 141 is formed in the substrate 110.

Herein, taking an N-doped silicon substrate as an example of the substrate 110, the active pillar 141 may be formed by P-doping to the semiconductor pillar 113. Exemplarily, as shown in FIG. 3, in the upward direction from the substrate 110, the active pillar 141 includes a source 1411 region, a channel region and a drain 1412 region arranged in sequence, or the active pillar 141 includes a drain 1412 region, a channel region and a source 1411 region arranged in sequence.

After the active pillars 141 are formed, the gate insulating layer 142 is formed in the substrate 110. As shown in FIG. 3, the gate insulating layer 142 wraps the outer sidewall of the channel region of the active pillar 141. Exemplarily, the gate insulating layer 142 may be a ring structure, and the gate insulating layer 142 completely wraps the periphery of the channel region. Or, the gate insulating layer 142 may be a semi-ring structure, and the gate insulating layer 142 surrounds part of the outer sidewall of the channel region, while the other part of the outer sidewall of the channel region is exposed outside the gate insulating layer 142.

Referring to FIG. 3, for the transistor 140 without an independent gate, the switching state of the transistor 140 is directly controlled by the word line 130. In this regard, after the gate insulating layer 142 is formed, the word line 130 may be formed in the substrate 110, and the word line 130 may extend in the second direction. The word line 130 is located in the height interval where the active pillar 141 is located. Specifically, the word line 130 is located in the height interval where the gate insulating layer 142 is located, the word line 130 contacts the gate insulating layer 142 and corresponds to the gate insulating layer 142, it may surround at least part of the region in the circumferential direction of the channel region.

For the transistor 140 with an independent gate, after the gate insulating layer 142 is formed, a gate may be formed, and the gate wraps the outside of the gate insulating layer 142. Then the word line 130 is formed in the substrate 110. The word line 130 is located in the height interval where the gate is located, and the word line 130 wraps the gate.

After the word lines 130 are formed, contact plugs 151 may be formed on the top surface of the substrate 110. The contact plugs 151 correspond to the active pillars 141 one by one, and the bottom surface of the contact plug 151 contacts the top surface of the active pillar 141. Thereafter, a capacitor is formed on the top surface of the contact plug 151, and the capacitor is electrically connected to the active pillar 141 through the contact plug 151.

In the descriptions of the disclosure, it is to be understood that the orientation or location relationships indicated by the terms "center", "longitudinal", "transverse", "length", "width", "thickness", "upper", "lower", "front", "rear", "left", "right", "vertical", "horizontal", "top", "bottom", "inner" and "outer" are orientation or location relationships shown on the basis of the drawings, which are only for the convenience of describing the disclosure and simplifying the descriptions, rather than indicating or implying that the referred apparatuses or elements must have a specific orientation, and be constructed and operated in the specific orientation. Therefore, it cannot be understood as a limitation to the present disclosure.

In the description of the disclosure, it is to be understood that terms "comprise," "comprising," "include," "including," "has," "having" or any other variations thereof used herein are intended to cover a non-exclusive inclusion. For example, a process, method, system, product or device that includes a list of steps or units is not necessarily limited to only those steps or units but may include other steps or units not expressly listed or inherent to such process, method, product or device.

Unless otherwise specified and defined, terms "mounting", "mutual connection", "connection", and "fixing" shall be generally understood. For example, the term may be fixed connection, or detachable connection, or integral connection. The term may also be direct connection, or indirect connection through an intermediate, or communication inside two elements, or interactive relationship between two elements. Those of ordinary skill in the art may understand the specific meanings of the terms in the disclosure according to specific conditions. In addition, terms "first", "second", etc. are only used for describing purposes, and cannot be understood as indicating or implying relative importance or implicitly indicating the number of indicated technical features.

Finally, it is to be noted that the above embodiments are only used to illustrate the technical solutions of the disclosure, but not to limit them. Although the disclosure has been described in detail with reference to the foregoing embodiments, those of ordinary skill in the art should understand that the technical solutions described in the foregoing embodiments can still be modified or some or all of the technical features can be equivalently replaced. However, these modifications or substitutions do not make the essence of the corresponding technical solutions deviate from the scope of the technical solutions of each embodiment of the disclosure.

What is claimed is:

1. A semiconductor structure, comprising:
a substrate;
bit lines located in the substrate, a bit line comprising a main body and a plurality of contact portions, the main body extending in a first direction, the contact portions being connected to the main body and extending toward a top surface of the substrate, and the plurality of contact portions being arranged at intervals in the first direction; and
transistors, a transistor being located on a top surface of a contact portion, an extension direction of a channel of a transistor being perpendicular to a plane where the substrate is located, the transistor comprising an active pillar which directly contacts the top surface of the contact portion, an extension direction of the active pillar being perpendicular to the plane where the substrate is located.

2. The semiconductor structure of claim 1, wherein a material of the contact portion is same with a material of the main body.

3. The semiconductor structure of claim 1, wherein a height of the contact portion ranges from 50 to 200 nm.

4. The semiconductor structure of claim 1, wherein the transistor further comprises:
a gate insulating layer surrounded on an outer sidewall of a channel region of the active pillar.

5. The semiconductor structure of claim 4, wherein in an upward direction from the substrate, the active pillar comprises a source region, the channel region and a drain region arranged in sequence, or the active pillar comprising the drain region, the channel region and the source region arranged in sequence.

6. The semiconductor structure of claim 4, further comprising:
word lines, located on a side of the bit line opposite to a bottom of the substrate and extending in a second direction, wherein the second direction and the first direction cross each other.

7. The semiconductor structure of claim 6, wherein a word line surrounds a periphery of the gate insulating layer.

8. The semiconductor structure of claim 1, further comprising:
a contact plug located on a top surface of the transistor opposite to the bit line; and
a capacitor located on a top surface of the contact plug opposite to the transistor.

9. A method for manufacturing a semiconductor structure, comprising:
providing a substrate;
forming bit lines, wherein a bit line is formed in the substrate and comprises a main body and a plurality of contact portions, the main body extends in a first direction, the contact portions are connected to the main body and extend toward a top surface of the substrate, and the plurality of contact portions are arranged at intervals in the first direction; and
forming transistors, wherein a transistor is formed on a top surface of a contact portion opposite to the main body, an extension direction of a channel of the transistor being perpendicular to a plane where the substrate is located, the transistor comprising an active pillar which directly contacts the top surface of the contact portion, an extension direction of the active pillar being perpendicular to the plane where the substrate is located.

10. The method of claim 9, wherein the forming bit lines comprises:
forming first trenches, wherein a first trench is located in the substrate and extends in the first direction;
forming an isolation layer, wherein the isolation layer is located in the first trenches;
forming second trenches, wherein a second trench is located in the substrate and extends in a second direction, the second direction crossing the first direction, and the substrate located between the first trenches and the second trenches forming columnar structures;
forming a metal layer, wherein the metal layer is located in the second trenches;
removing first part of the metal layer; and
processing the metal layer and the substrate to form the bit lines in the substrate.

11. The method of claim 10, wherein the processing the metal layer and the substrate comprises:
processing the metal layer and the substrate by an annealing process, so that metal particles of second part of the metal layer penetrate into the substrate to form a metal composite layer, the metal composite layer forming the bit lines; and
removing the metal layer not penetrating into the substrate.

12. The method claim 10, wherein after removing the first part of the metal layer, a height of a remaining metal layer occupies $\frac{1}{10}$-$\frac{1}{2}$ of a depth of the second trench.

13. The method of claim 10, wherein the removing first part of the metal layer comprises:
etching the metal layer with an oxidizing solution to form an oxide layer on sidewall surfaces of the second trenches.

14. The method of claim 10, after forming the bit lines and before forming the transistors, further comprising:
forming a silicon oxide layer, wherein the silicon oxide layer covers inner wall surfaces of the second trenches; and
forming a silicon nitride layer, wherein the silicon nitride layer is located in the second trenches and covers the silicon oxide layer.

15. The method of claim 10, wherein the forming transistors comprises:
doping the columnar structures to form active pillars of the transistors, wherein in an upward direction from the substrate, the active pillar comprises a source region, a channel region and a drain region arranged in sequence, or the active pillar comprising the drain region, the channel region and the source region arranged in sequence; and
forming a gate insulating layer, wherein the gate insulating layer wraps an outer sidewall of the channel region.

16. The method of claim 15, after forming the transistors, further comprising:
forming word lines, wherein a word line extends in the second direction, the word line surrounding at least part of a circumferential region of the transistor and contacting the gate insulating layer;
forming a contact plug, wherein the contact plug is formed on a top surface of the active pillar opposite to the bit line; and
forming a capacitor, wherein the capacitor is formed on a top surface of the contact plug opposite to the active pillar.

17. A method for manufacturing a semiconductor structure, comprising:
- providing a substrate;
- forming bit lines, wherein a bit line is formed in the substrate and comprises a main body and a plurality of contact portions, the main body extends in a first direction, the contact portions are connected to the main body and extend toward a top surface of the substrate, and the plurality of contact portions are arranged at intervals in the first direction; and
- forming transistors, wherein a transistor is formed on a top surface of a contact portion opposite to the main body, an extension direction of a channel of the transistor being perpendicular to a plane where the substrate is located;
- wherein the forming bit lines comprises:
- forming first trenches, wherein a first trench is located in the substrate and extends in the first direction;
- forming an isolation layer, wherein the isolation layer is located in the first trenches;
- forming second trenches, wherein a second trench is located in the substrate and extends in a second direction, the second direction crossing the first direction, and the substrate located between the first trenches and the second trenches forming columnar structures;
- forming a metal layer, wherein the metal layer is located in the second trenches;
- removing first part of the metal layer; and
- processing the metal layer and the substrate to form the bit lines in the substrate.

18. The method of claim 17, wherein the processing the metal layer and the substrate comprises:
- processing the metal layer and the substrate by an annealing process, so that metal particles of second part of the metal layer penetrate into the substrate to form a metal composite layer, the metal composite layer forming the bit lines; and
- removing the metal layer not penetrating into the substrate.

19. The method of claim 17, wherein after removing the first part of the metal layer, a height of a remaining metal layer occupies $1/10$-$1/2$ of a depth of the second trench.

20. The method of claim 17, wherein the removing first part of the metal layer comprises:
- etching the metal layer with an oxidizing solution to form an oxide layer on sidewall surfaces of the second trenches.

* * * * *